US005122993A

United States Patent [19]

Hikita et al.

[11] Patent Number: 5,122,993

[45] Date of Patent: Jun. 16, 1992

[54] PIEZOELECTRIC TRANSDUCER

[75] Inventors: Kazuyasu Hikita; Harumi Kanai; Yoshiaki Tanaka, all of Chichibu, Japan

[73] Assignee: Mitsubishi Mining & Cement Co., Ltd., Tokyo, Japan

[21] Appl. No.: 707,307

[22] Filed: May 29, 1991

Related U.S. Application Data

[63] Continuation of Ser. No. 487,896, Mar. 6, 1990, abandoned.

[30] Foreign Application Priority Data

Mar. 7, 1989 [JP] Japan .................................... 1-55711

[51] Int. Cl.$^{5}$ .............................................. H01L 41/08

[52] U.S. Cl. .................................... 367/155; 310/366; 128/662.03

[58] Field of Search ................ 128/24 A, 660.03, 804, 128/662.03; 367/150, 152, 157, 162, 164, 155; 310/326, 337, 335, 365, 366; 73/625, 626, 642

[56] References Cited

U.S. PATENT DOCUMENTS

| | | | |
|---|---|---|---|
| 4,012,952 | 3/1977 | Dory | 367/150 |
| 4,217,516 | 8/1980 | Iinuma et al. | 310/335 |
| 4,424,465 | 1/1984 | Ohigashi et al. | 310/335 |
| 4,440,025 | 4/1984 | Hayakawa et al. | 367/150 X |
| 4,734,963 | 4/1988 | Ishiyama | 310/335 X |

FOREIGN PATENT DOCUMENTS 2140693 12/1984 United Kingdom ................ 367/150

OTHER PUBLICATIONS

The Random House College Dictionary, Random House, Inc. 1980, p. 393.

*Primary Examiner*—Brian S. Steinberger
*Attorney, Agent, or Firm*—Cushman, Darby & Cushman

[57] ABSTRACT

A piezoelectric transducer having plural piezoelectric transducer elements which can generate mechanical vibrations converging substantially on one point. The transducer is formed to control the convergent point by insulating piezoelectric transducer elements mechanically, arranging them concentrically and driving them independently and separately from each other.

7 Claims, 9 Drawing Sheets

PIEZOELECTRIC TRANSDUCER

This is a continuation of application Ser. No. 07/487,896, filed on Mar. 6, 1990 now abandoned.

FIELD OF THE INVENTION

This invention relates to a piezoelectric transducer which converts electric signals into sound waves or other mechanical vibrations, or converts mechanical vibrations into electric signals. This invention is applicable to sound radiation, focusing, transmission and receiving. This invention is suitable for use in transmission/reception of sound waves into/from the water and/or the human body, and more particularly as a probe in an ultrasonic diagnostic apparatus.

BACKGROUND OF THE INVENTION

Piezoelectric transducers have been conventionally used to convert electric signals into sound waves or other mechanical vibrations, or to convert mechanical vibrations into electric signals. They convert electric signals into mechanical vibrations or vice versa by utilizing the morphological change of a crystal which occurs on voltage application, or conversely by monitoring the voltage generated by a pressure applied on a crystal.

As an example of piezoelectric transducer, a probe in an ultrasonic diagnostic equipment is well known. Such a probe is taught in Ide, M.: Recent medical applications of ultrasonic waves; the Journal of Acoustic Society of Japan, Vol. 33, No. 10, 1977, pp. 586-591 (in Japanese), and in Ide, M.: Recent progress in ultrasonic diagnostic apparatus; the Journal of Acoustic Society of Japan, Vol. 36, No. 11, 1980, pp. 576-580 (in Japanese). The former describes in detail the scanning systems for linear, arc-shaped, circular, sector, radial and other ultrasonic beams while the latter explains the principle of the electronic linear scanning method which is recently used quite widely, the structure of an actual electronic linear scanning probe, and the principle of deflection of ultrasonic beams caused by the phase delay.

The probe for the linear scanning method, however, is defective in that radiated ultrasonic beams focus linearly. Focusing on a spot is most desirable to obtain images with high positional precision. In order to focus ultrasonic beams, it is desirable to have a sound source which has a curved surface, especially a spherical surface.

This apparatus has a patent application for a piezoelectric transducer in which the sound source has a curved surface (JPA laid-open Sho 60-111600, referred to herein as the Application '600). The specification and drawings of this application '600 show an embodiment of a piezoelectric transducer with a curved surface which is formed on a curved base, and describe sound radiation and focusing. However, the device in the application '600 is not intended to be used as a probe, and therefore does not consider the focus control of beams.

In order to control the convergent point of radiated beams by the device of application '600, a method is conceivable wherein ring-shaped electrodes are arranged concentrically and formed into plural piezoelectric transducer elements, and driving pulses which are applied to each of the respective elements are sequentially delayed. But this method is also defective because when driving pulses are fed to an arbitrary electrode, two things happen. First the driven section vibrates due to the expansion/contraction caused by piezoelectric effect→the vibration is transmitted to an adjacent piezoelectric transducer element, and voltage signals are generated on the electrodes of the element due to its piezoelectric characteristics→vibration is thus further transmitted to an element adjacent thereto. Second, an electric field is generated inside a piezoelectric transducer element due to the supplied driving pulses→the electric field leaks to another element adjacent thereto to drive it, or an electric voltage is apparently generated between electrodes of the element. When it is used as a probe, sound waves excited by electric driving pulses are radiated at a target (e.g. bio tissues) and the sound waves reflected therefrom are received and converted into electric signals by using a single element. Therefore, if vibration or voltage is leaked to other elements, the state becomes similar to when ultrasonic signals are inputted from outside to cause noise.

This invention was conceived to solve such problems as encountered in the prior art and aims to provide a piezoelectric transducer which can generate mechanical vibrations focusing substantially on one point (a convergent point) and which can control such convergent point.

SUMMARY OF THE INVENTION

The piezoelectric transducer according to this invention is characterized in that plural piezoelectric transducer elements are concentrically arranged on the same base in mechanical and electrical insulation from each other, and at least one of the electrodes is provided as a separate electrode for each of the elements. The form of the piezoelectric transducer elements is preferably such that the peripheral shape of the central element is substantially circular while the shape of surrounding ones is annular. All the elements may be annular. Alternatively, circular or annular elements may be radially sectioned.

Each of the piezoelectric transducer elements includes a first electrode formed between the base and the element, a piezoelectric material formed on the surface of the first electrode, and a second electrode formed on the surface of the piezoelectric material. The second electrode is mechanically and electrically insulated from other piezoelectric transducer elements. The piezoelectric materials are also insulated from each other.

The base has a surface on which plural piezoelectric transducer elements may be arranged. But in order to converge or radiate generated vibrations (acoustic waves), it is preferable to have a curved surface base and to arrange plural piezoelectric transducer elements along the curve. A spherical surface or a parabolic surface is suitable as the curved surface.

The first electrode may be used commonly for the plural piezoelectric transducer elements. If the base is electrically conductive, the base itself may be used as the first electrode.

The material for the piezoelectric transducer elements preferably contains at least one ceramic selected from the group consisting of barium titanate, lead titanate, lead zirconate titanate or a compound of the lead zirconate titanate group, and is processed for polarization. It may be polyvinylidene fluoride or its copolymer. The material for the base may be polyurethane, silicone rubber, epoxy resin or other organic resinous materials.

The plural piezoelectric transducer elements are preferably structured to have substantially identical electrostatic capacities between the first and the second electrodes respectively. For convenience in use, it may be desirable to coat the surface of the piezoelectric transducer elements with a resin film.

When piezoelectric transducer elements which are arranged concentrically are driven from outside at staggered timings, the mechanical vibrations, especially acoustic waves, can be conveyed on one arbitrary point depending on the driving timing. The second field obtained at the time is referred to as a conveyed sound field.

Such a converged sound field may be obtained by forming annular concentric electrodes on a flat plate having a piezoelectric characteristic and driving them sequentially from the outermost one. In that case, however, when one of the piezoelectric transducer elements is electrically driven, mechanical stresses, vibrations and electric fields are inevitably transmitted to an adjacent element via the piezoelectric materials. This, in turn, generates acoustic waves and vibrations from the adjacent piezoelectric transducer element to deteriorate the convergent factor and to cause noise.

According to this invention, the piezoelectric materials are provided with gaps so as to reduce mechanical stresses or vibrations which would otherwise be transmitted to adjacent elements. An electric field, if applied on a piezoelectric transducer element, rarely affects adjacent elements via piezoelectric materials. Therefore, when plural piezoelectric transducer elements are independently driven, this invention device would receive less influence from the signal voltage which drives adjacent elements to thereby converge or radiate a sound field with a high precision.

When the piezoelectric transducer elements of this invention are arranged on a curved surface, especially a spherical surface or a parabolic surface, the sound field may be converged or radiated with still a higher precision.

When an electrode on the side of the base is commonly used, especially when the base itself is used as the electrode, the process for forming the electrodes can be simplified.

The conversion efficiency is enhanced as the device uses such materials for the piezoelectric material as barium titanate, lead titanate, lead zirconate titanate, a compound of the lead zirconate titanate group, polyvinylidene fluoride or its copolymer.

When an organic resin is used for the base, the acoustic impedance thereof is less than that of ceramics and closer to that of water or of the human body. Therefore, attenuation of acoustic waves outputted from the piezoelectric transducer can be reduced, and that of the acoustic waves reflected from underwater can also be reduced. Moreover, as the vibration of the base itself is quickly attenuated, that of the piezoelectric transducer mounted thereon may also be quickly attenuated. In short, the interval of acoustic wave generations can be shortened to thereby enhance time resolution simply by selecting the material and thickness of the base suitably. The base may be used as the matching layer.

As electrostatic capacities of respective piezoelectric transducer elements are identical to each other, the impedance can be adjusted more easily to facilitate distribution of input power among elements.

Insulation among elements may be increased to enhance environmental resistance by coating the surface of the piezoelectric transducer elements with resin. If the resin coating is used as a backing layer, unnecessary sound or vibration may be absorbed thereby to reduce the influence of the sound field.

As described in the foregoing, this invention piezoelectric transducer elements can generate mechanical vibrations, and especially acoustic waves which coverage substantially at one point, and can control the convergent point.

As this invention device can converge radiated beams at a point and is highly resistant to noises, it is quite effective when used as a probe in an ultrasonic diagnostic apparatus to provide images with high positional precision.

When the piezoelectric transducer elements are arranged on a parabolic surface to generate parallel beams, the beams have excellent collimation, and are highly effective as a fish finder or a sound navigation and ranging (SONAR) system.

This invention device is further applicable to a speaker which can be installed at any arbitrary location to converge the sound field at a specific position.

BRIEF DESCRIPTION OF THE DRAWINGS

These and other aspects of the invention will now be described in detail with reference to the accompanying drawings, wherein.

DESCRIPTION OF THE PREFERRED EMBODIMENT

Figure 1:
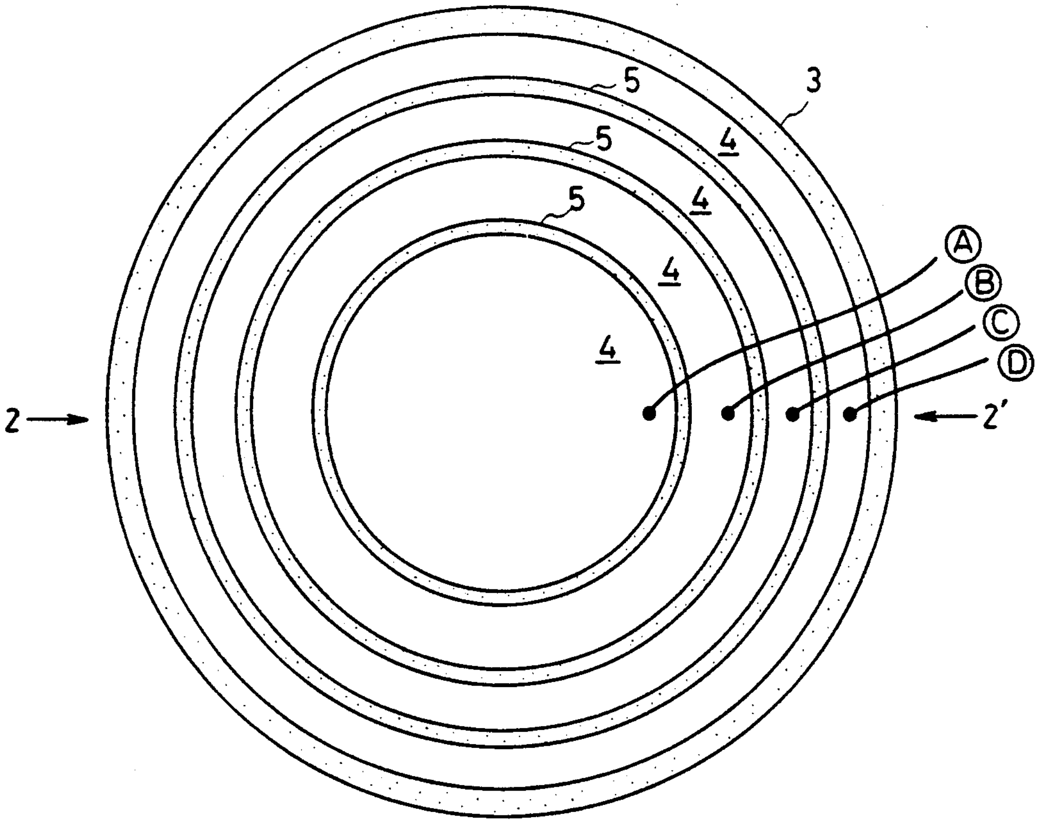
FIG. 1 is a top view of the first embodiment of the piezoelectric transducer according to this invention.
Figure 2:
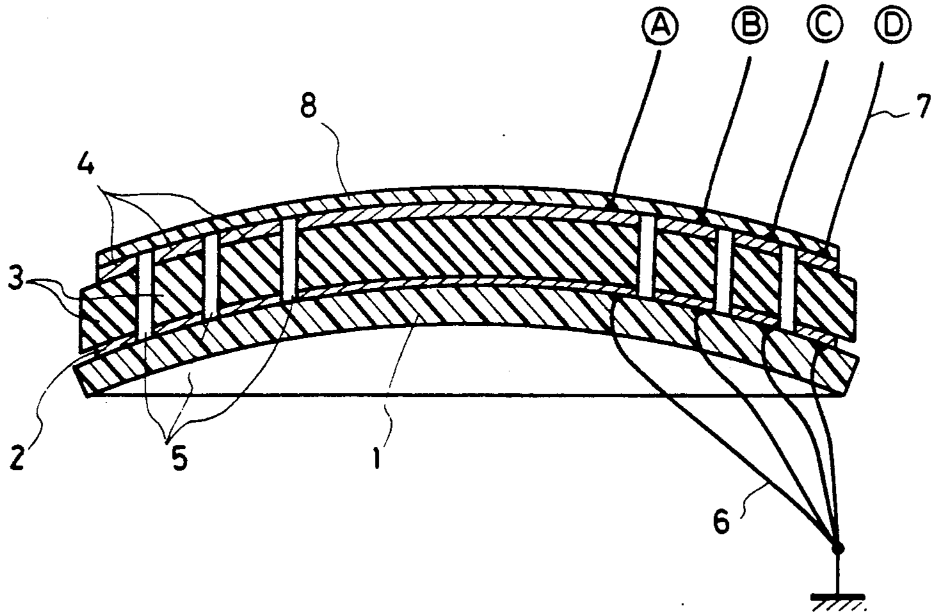
FIG. 2 is a sectional view of the first embodiment.

FIGS. 1 and 2 show the first embodiment of the piezoelectric transducer according to this invention, a top view in FIG. 1 and a sectional view along the line 2—2′ of FIG. 1 being shown in FIG. 2.

The piezoelectric transducer includes plural piezoelectric transducer elements mounted on a base 1. Each of the elements includes a first electrode 2 formed between the base 1 and the element, a piezoelectric material 3 formed on the first electrodes 2, and second electrodes 4 formed on the surface of the piezoelectric material 3.

This device has plural piezoelectric transducer elements arranged concentrically and insulated from each other mechanically as well as electrically. Each of the elements is separately provided with a second electrode 4. More particularly, gaps 5 are provided between two adjacent elements, the central element is in the form of a dome (a circle in a plan view), and the elements surrounding the central dome are in annular form.

The surfaces of the piezoelectric transducer elements are coated with a resin film 8, but the film 8 is not shown in FIG. 1 in order to show the inside.

The device is manufactured by the following steps.

A dome-shaped ceramic piece of 25 mm diameter, 200 μm thickness, and 80 mm of radius of curvature and made of lead zirconate titanate (hereinafter referred to as PZT) is applied on the concave surface as well as on the convex surface with silver electrodes and baked. The peripheral edge of the ceramic piece is not provided with electrodes so as to secure electrical insulation between the concave and convex surfaces. In this embodiment, PZT is prepared by adding 0.5 wt % of $Nb_2O_5$ to $Pb(Zr_{0.53}Ti_{0.47})O_3$. $Nb_2O_5$ is added in order to increase the piezoelectric characteristic so as to enhance the process for polarization at subsequent steps.

Then, the piece is cut into plural annular elements in a manner to have equal electrostatic capacity between the electrodes in each ring. This is simply done by making the area of each electrode equal. Since the thickness of the dome-shaped piece is uniform, an equal area will form an equal electrostatic capacity.

More particularly, the piece is divided into one dome-shaped piezoelectric transducer element and three annular piezoelectric transducer elements by using an ultrasonic machine and three cylindrical horns of different diameters. The dimensions of the elements are as follows:

(1) The outer diameter of the central dome-shaped element: 1.4 mm (2) The inner diameter and the outer diameter of the annular piezoelectric transducer element adjacent to the above: 11.4 mm and 15.4 mm respectively (3) The inner diameter and the outer diameter of the annular piezoelectric transducer element adjacent to the above: 16.4 mm and 19.4 mm respectively (4) The inner diameter and the outer diameter of the annular piezoelectric transducer element adjacent to the above: 20.4 mm and 23.0 mm respectively.

Figure 3:
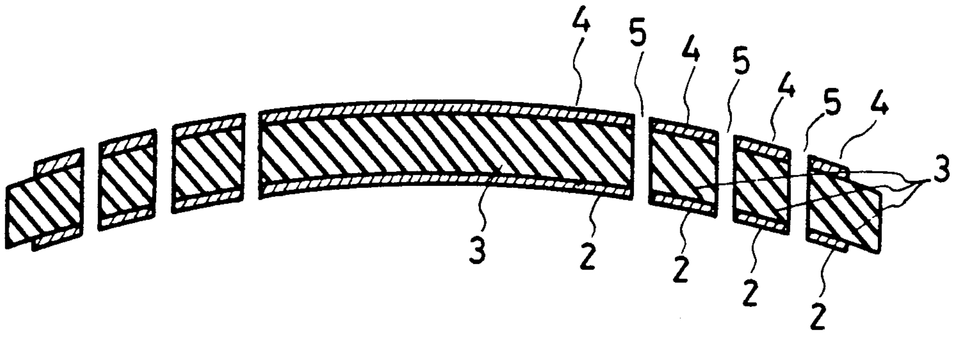
FIGS. 3 and 4 are sectional views of the transducer in respective manufacturing steps.

The first electrode 2, the piezoelectric material 3 and the second electrode 4 were made by the above steps. FIG. 3 shows the obtained elements in section.

Leads 6 are soldered to the 4 elements on the concave sides thereof, and the elements are mounted on base 1.

A dome-shaped polyurethane resin piece of 0.5 mm thickness, 27 mm of diameter and 80 mm of radius of curvature on the convex side is used as base 1, and through holes are opened at predetermined positions in 0.2–0.5 mm diameter to let the leads 6 pass therethrough. Leads 6 pass through the holes respectively, and elements are attached on the base 1. More particularly, the same urethane resin as the base 1 is applied on piezoelectric transducer elements on the concave surfaces thereof, and abutted upon the base 1 under suitable conditions to harden the resin in order to fix the elements thereto.

The resin is filled into the through holes on the base 1 to fix the leads 6 as well as to secure a pneumatic sealing between the concave surface of the base 1 and the concave surfaces of the elements. The gaps 5 are provided between elements at an equal interval so that the electric signals and mechanical vibrations are not transmitted to adjacent elements.

The elements are then processed for polarization in silicone oil.

Figure 4:
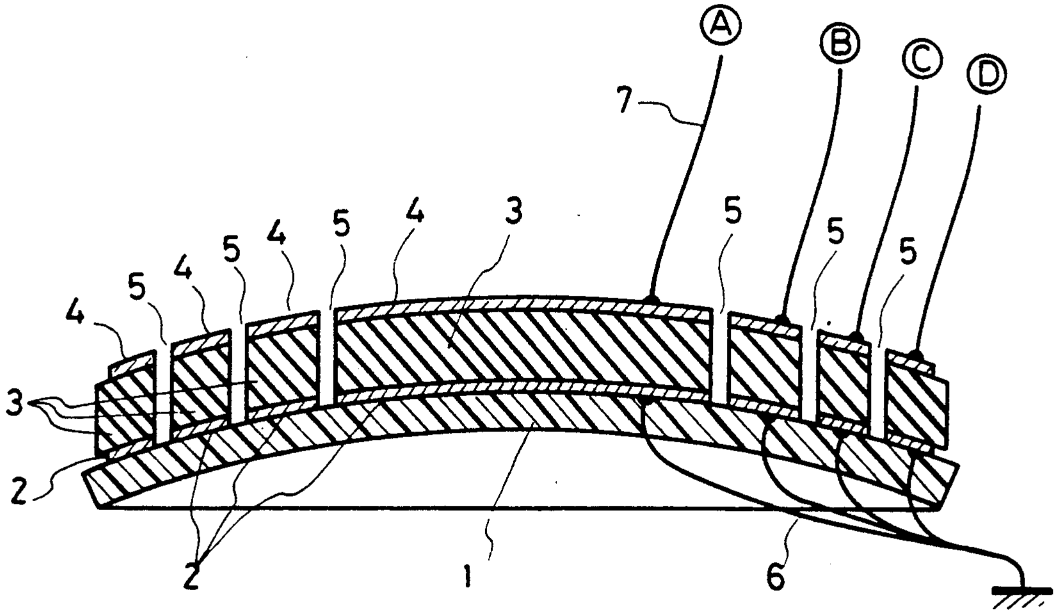

For this process, four leads 6 connected to each of the piezoelectric transducer elements on the concave side thereof are connected to ground, and the electrodes 4 on the convex side are firmly attached to positive terminals. The piece is immersed in silicone oil at 120° C., and an electric field is applied at the rate of 2–3 kV per 1 mm for 20–30 minutes to polarize the material 3. After the processing, the element is taken out of the oil, cleansed with ethanol or the like, and dried. The leads 7 are soldered to the convex surfaces of the piezoelectric transducer elements. FIG. 4 shows the thus prepared elements in section.

The same urethane resin as that used for the base 1 is applied on the convex surfaces of the elements to harden, thereby forming the resin coating 8. The coating 8 can enhance the insulation and environmental resistance of the elements. The coating 8 may be used as a backing layer so as to absorb unnecessary sounds or vibrations in the direction of the convex side. Alternatively, a backing layer may further be provided upon the resin coating 8.

Figure 5:
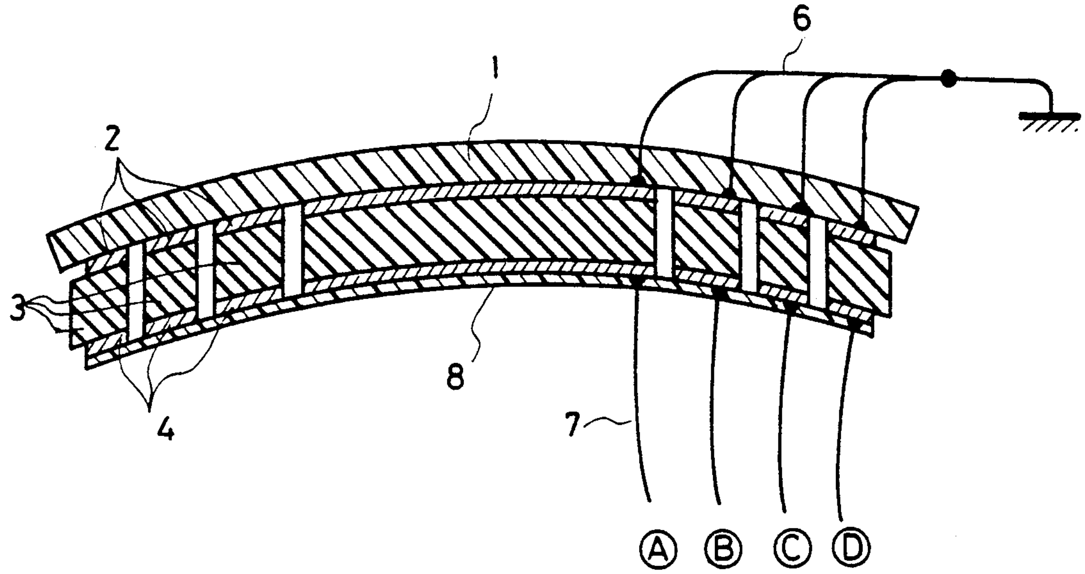
FIG. 5 is a sectional view of the second embodiment of the piezoelectric transducer according to this invention.

FIG. 5 shows the second embodiment of the piezoelectric transducer of this invention in cross section.

This embodiment differs from the first embodiment in that piezoelectric transducer elements are formed on the concave side of the base 1.

Although the base 1 is bored to provide through holes for the leads 6 in the foregoing embodiment, the first electrode 2 may be used commonly. For instance, when they were to be connected to ground, each of the leads 6 may be passed between the base 1 and the material 3. In such a case, water-tightness and environmental resistance can be raised. Thus this is highly desirable for applications when a side of the base without transducer elements is to be in contact with water.

In the above embodiment, the base 1 is shaped in advance to have a domed form. However, it is not necessary to shape it in advance so far as the base can maintain the positional relation among piezoelectric transducer elements. For instance, the base 1 could be shaped along the curvature of the elements simply by arranging the elements on the curvature at an interval and filling in resin to fix them.

Figure 6:
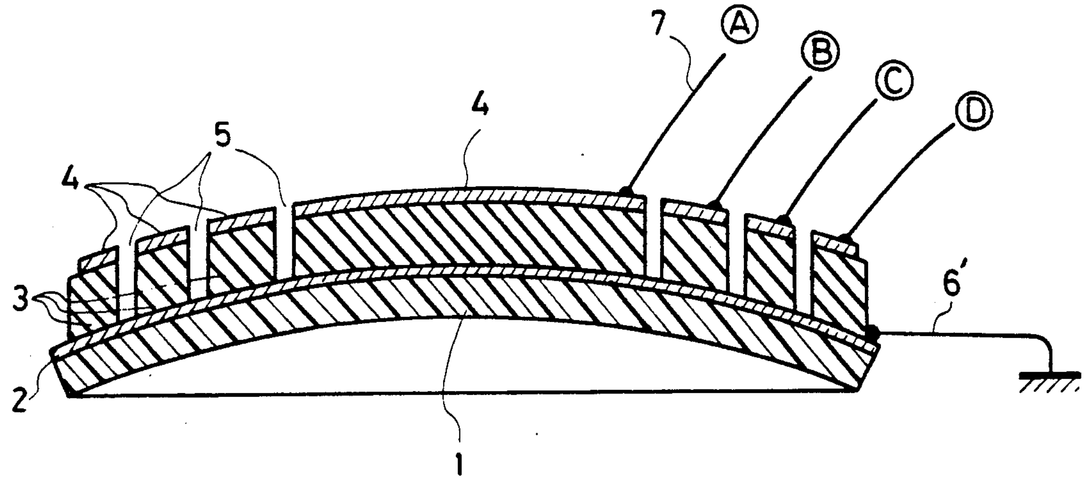
FIG. 6 is a sectional view of the third embodiment of the piezoelectric transducer according to this invention.

FIG. 6 shows the third embodiment of the piezoelectric transducer of this invention.

. The third embodiment differs from the first embodiment in that the first electrode 2′ is commonly used by all the piezoelectric transducer elements. In this embodiment, it is not necessary to open through holes on the base 1 to let the leads pass through.

The manufacturing process of this embodiment will now be described more specifically below. A base 1 of 27 mm diameter, 0.3 mm thickness and 60 mm radius of curvature on its convex surface is prepared in the form of a dome using epoxy resin. Conductive epoxy resin including a conductive material such as silver powder or other conductive substance is applied on the convex surface of the base 1, and hardened to form the first electrode 2′ on the convex surface.

Silver electrodes are formed on both sides of a dome-shaped PZT ceramics of 25 mm diameter, 200 μm thickness and 60 mm radius of curvature on the concave surface. The piece is divided into four sections, one of which is shaped circular and the other three annular, in a manner similar to the first embodiment.

The quarters are attached on the convex surface of the base 1 with a conductive epoxy resin of the same material as that used for the electrode 2′ on the surface of the base 1. The first electrode 2' is connected to leads 6' with conductive paste, while the second electrodes 4 are soldered to the leads 7.

In a manner similar to the first embodiment, an electric field of 3 kV/mm is applied between the first electrode 2' and the second electrodes 4 for polarization processing.

Because the second electrodes 4 are separately provided to each element, the piezoelectric transducer elements thus obtained with the second electrodes can be driven independently from the others. The mutual transmission of vibrations among elements is negligible, as in the first embodiment.

The reason why the base 1 has a curved form is because it could converge or radiate vibrations or sounds generated from piezoelectric transducer elements. The acoustic waves generated from the concave surfaces thereof may converge at a point on the curved surface to provide a high acoustic pressure.

The base and piezoelectric transducer elements may be arranged on a flat surface depending on the usage.

The characteristics of the piezoelectric transducer of the first embodiment were measured and this measurement will now be described.

Figure 7:
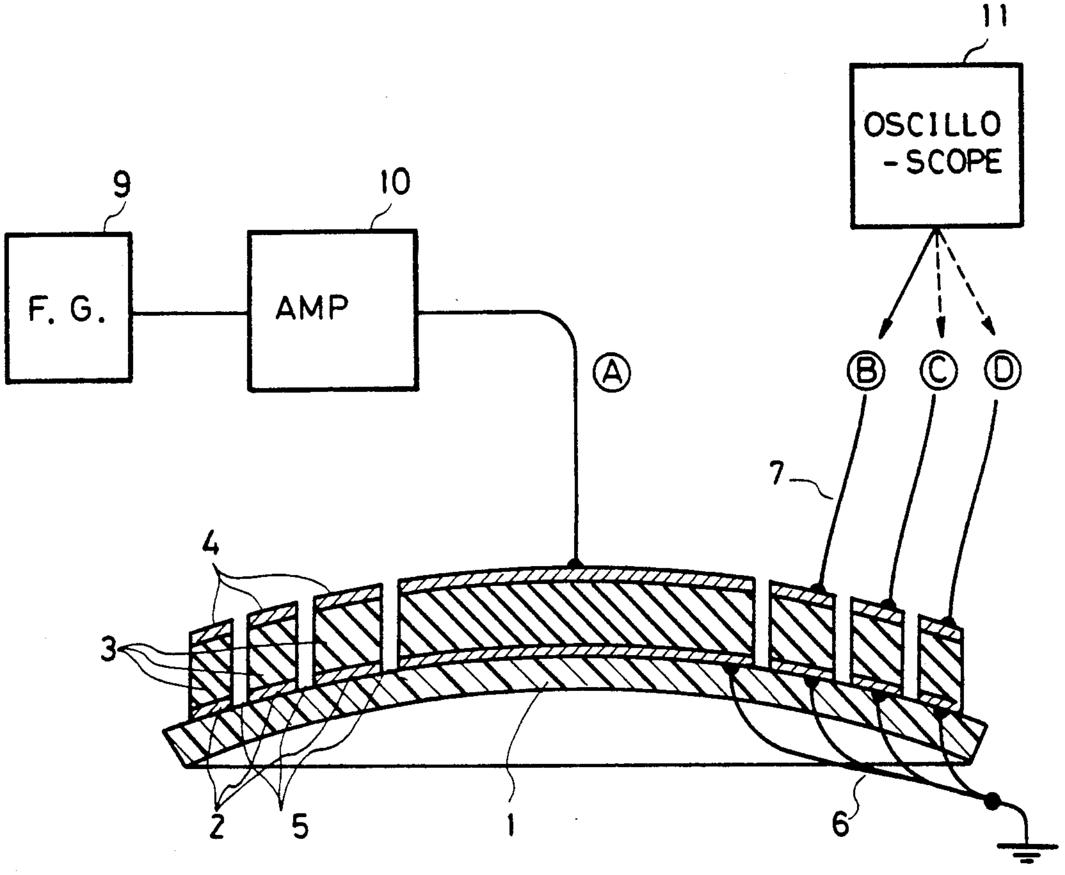
FIG. 7 is a view of a measurement device to show that mechanical vibrations and electric signals do not affect adjacent electrodes.

FIG. 7 shows a measurement device used to prove that mechanical vibration and electric signals would not affect adjacent electrodes.

The leads of 6 of respective piezoelectric transducer elements were grounded, and sine waves of ±10 V, 5 MHz were applied on the electrode 4 (referred to an electrode A) of the central dome-shaped element to drive it. The amplitude of the sine waves of the same frequency generated at the time on each of the electrodes of the annular piezoelectric transducer elements were measured. The sine waves used were generated from a function generator 9, and amplified by an amplifier 10 to be applied on the electrode A. The voltages generated on the electrodes 4 at this time (referred to as electrodes A, B, C, and D in order, from the electrode A to adjacent electrodes) were measured by an oscilloscope 11.

As a comparison, a device wherein plural piezoelectric transducer elements were connected to each other with the piezoelectric material without gaps thereon was prepared and voltage was measured.

Figure 8:
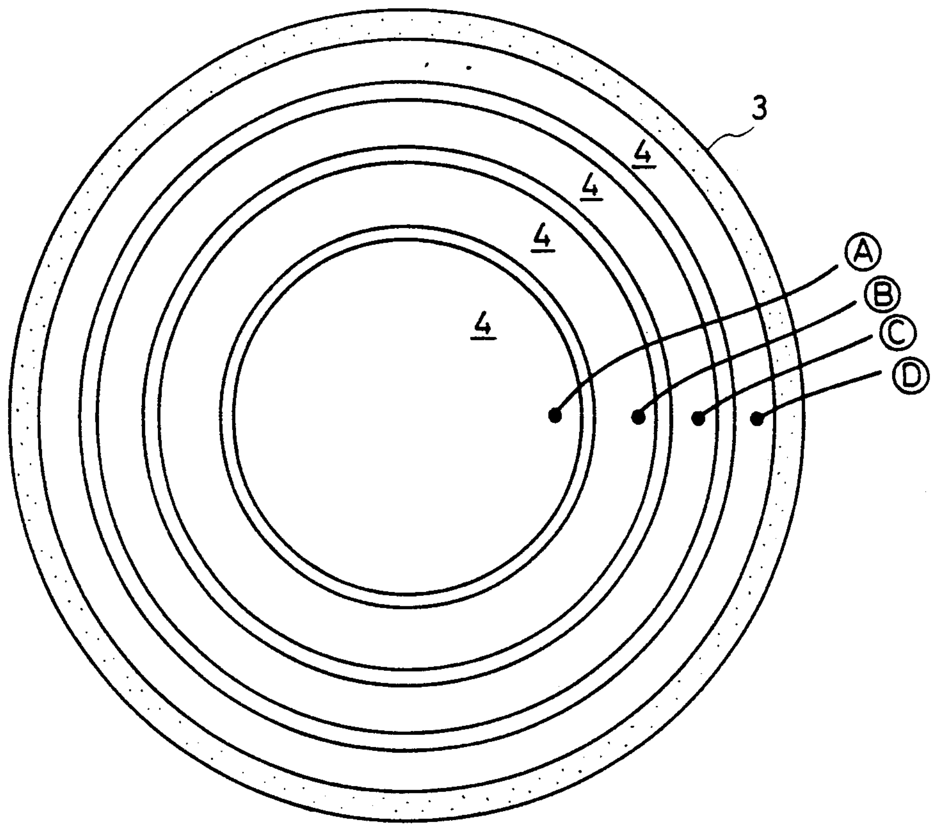
FIG. 8 is a top view of a comparative device.
Figure 9:
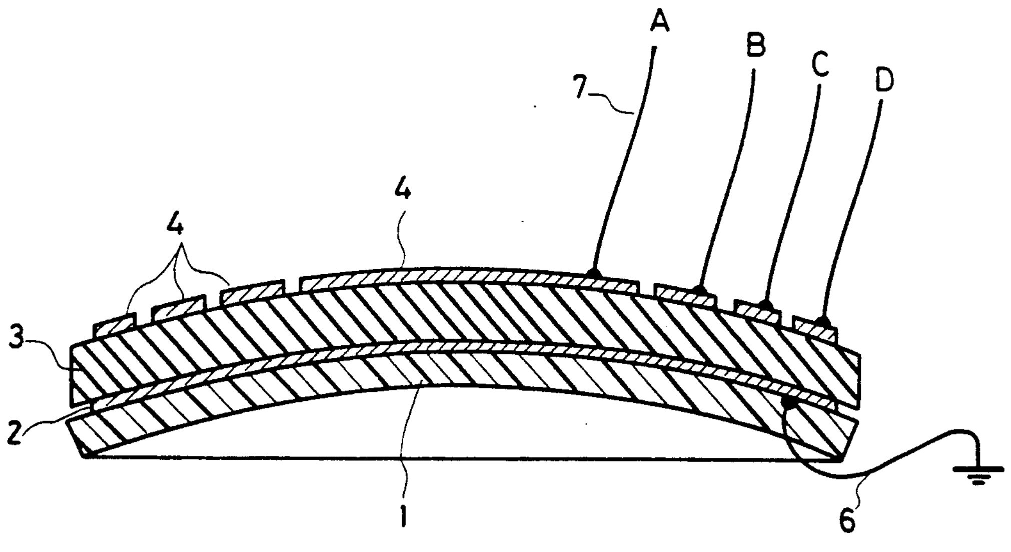
FIG. 9 is a sectional view of the comparative device.

FIGS. 8 and 9 show the comparison in a top view and in a sectional view respectively.

The comparative device is prepared by forming with silver the first electrodes 2 on the concave surface of a dome-shaped PZT ceramic piece of 25 mm diameter, 200 μm thickness and 80 mm radius of curvature of the concave surface, and forming on the convex surface a central electrode and three annular second electrodes 4. The dimension of the second electrodes 4 is the same as those of the first embodiment.

The first electrodes 2 of the elements were connected to the leads 6, attached on the concave surface thereof to the base 1, processed for polarization in a manner similar to the first embodiment, and respectively connected with the leads 7 by soldering.

Figure 10:
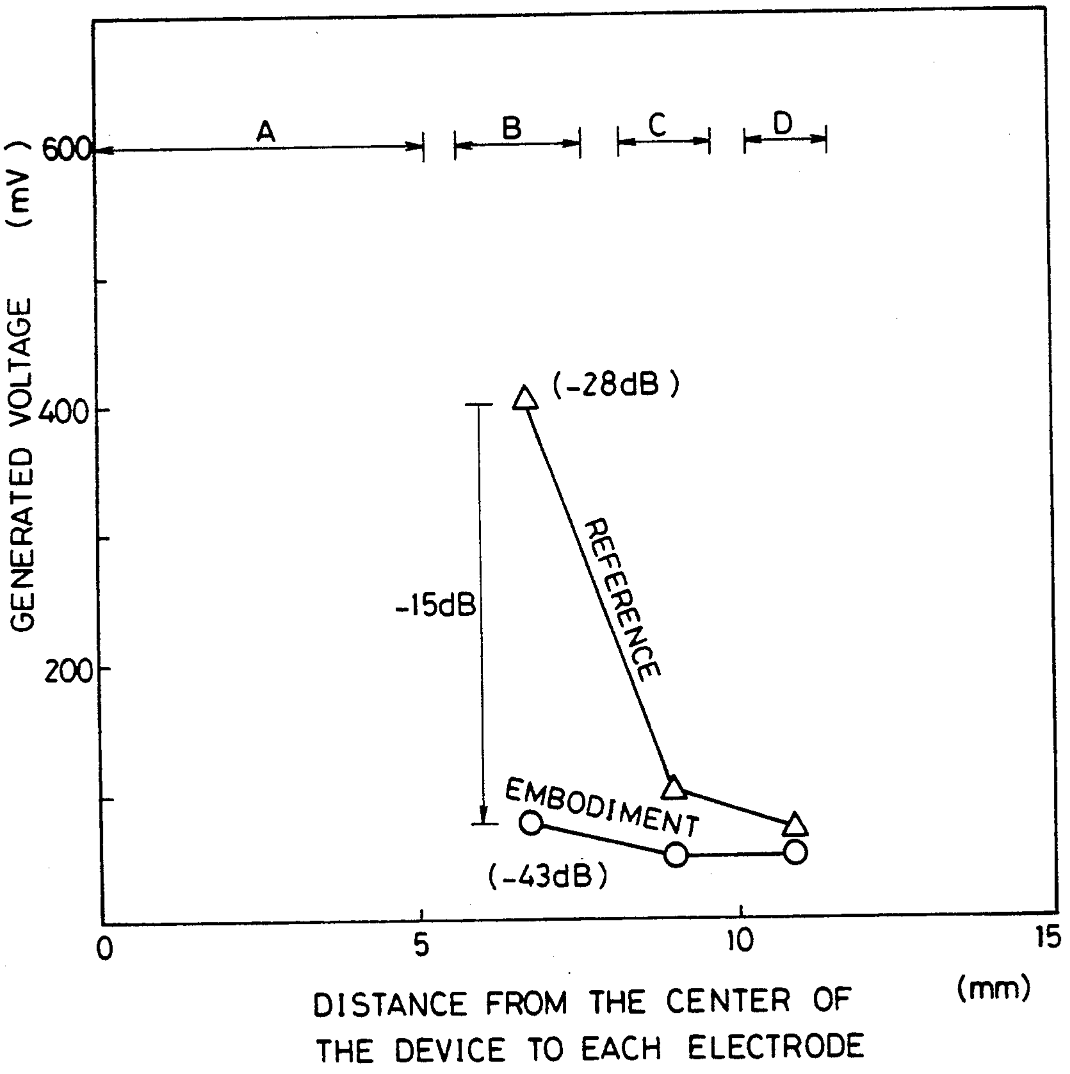
FIG. 10 is a graph to show the result of the measurement.

FIG. 10 shows the result of measurement. In the graph, the vertical axis represents generated voltages while the horizontal axis represents the distance between the center of the electrode A to each of the electrodes B, C, and D.

The amplitude of the waves generated in the second electrode B adjacent to the dome-shaped element is lower by 43 dB than the voltage applied on the electrode A in the first embodiment. The amplitudes of the waves generated in the third and fourth electrodes C and D were respectively less than 45 dB.

In the comparative device, on the other hand, the amplitude of the waves generated at the electrode B is reduced by only 28 dB from the voltage applied on the electrode A, which is 15 dB higher than the value obtained in this invention device. A similar tendency was observed in the electrodes C and D.

The experiment verified the effectiveness of forming the piezoelectric materials 3 into an annular shape.

Figure 11:
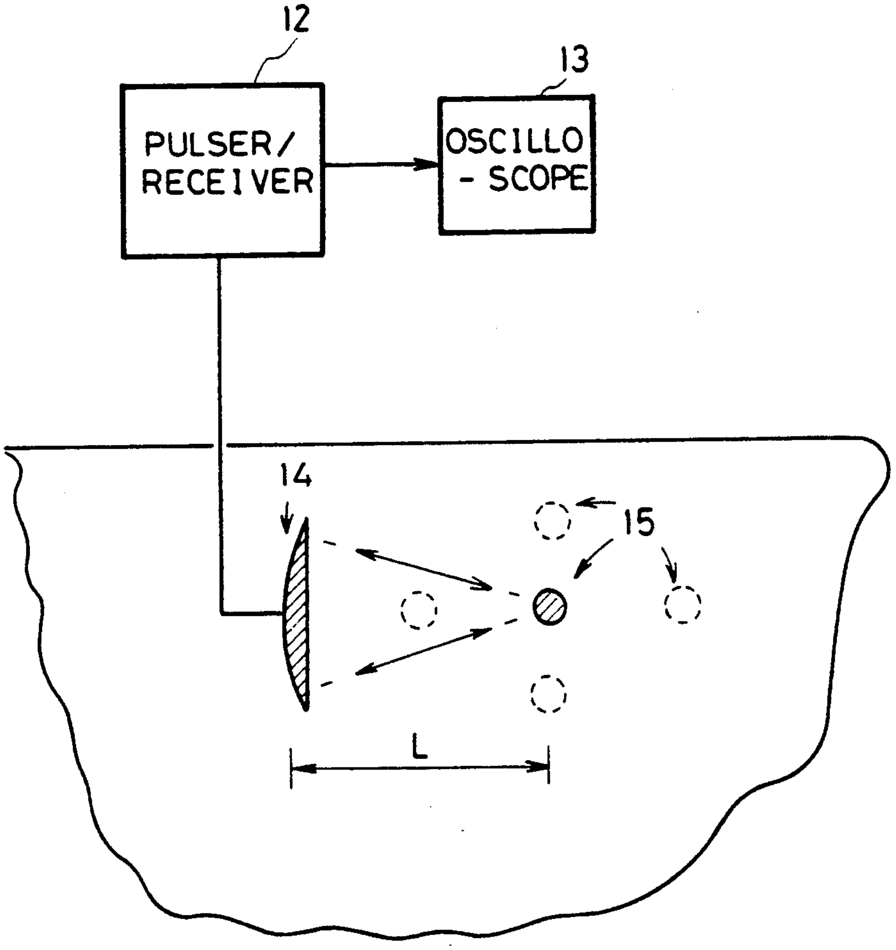
FIG. 11 is a view to show the measurement device of measuring convergence of acoustic waves.

FIG. 11 shows a device for measuring convergence of acoustic waves.

In this experiment, the piezoelectric transducer elements 14 obtained in the first embodiment were immersed in silicone oil, and simultaneously driven in all electrodes on the convex surface using the same waveform by electric pulses generated from a pulse oscillator/receiver 12 to generate acoustic waves on the concave surface in parallel to the level of the oil. A steel ball 15 of 5 mm diameter is supported with a fine wire and moved within the oil on the concave side surface. The acoustic waves reflected from the steel ball 15 are received by the receiver 12, and their waveforms are displayed on an oscilloscope 13.

As a result, when the steel ball 15 is arranged at its center which is approximately 80 mm apart from the center of the concave surface, or at a position closer to the spherical surface of the elements 14, the echo becomes the strongest. This verifies that if piezoelectric transducer elements of a spherical shape are used, acoustic waves are converged at their spherical center.

Figure 12:
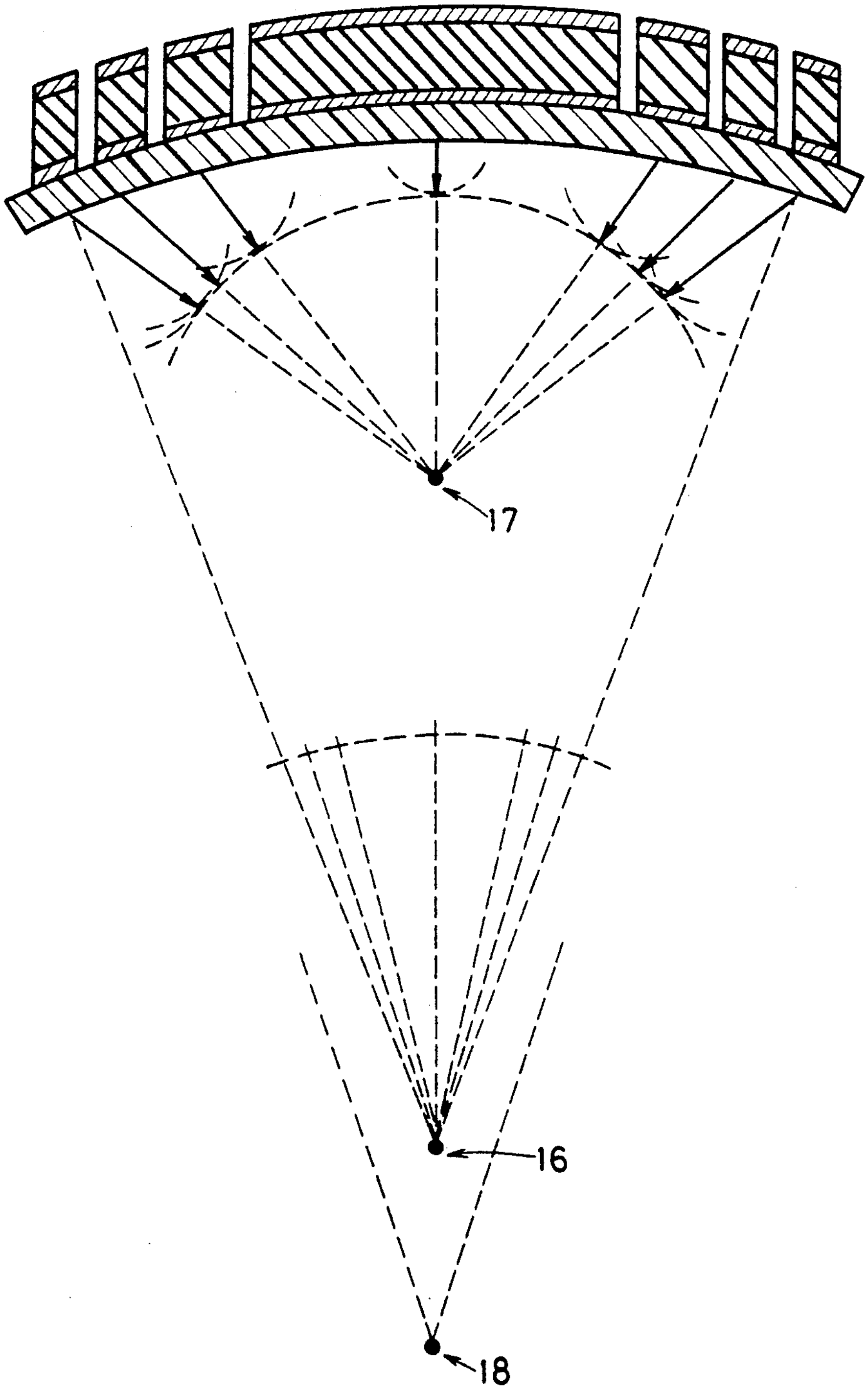
FIG. 12 is a view to show control over the focus position to which acoustic waves converge.

FIG. 12 shows the control of the convergence point where acoustic waves focus.

The piezoelectric transducer elements having a spherical shape explained in the foregoing, act as an acoustic lens such that sound fields converge on the concave surface thereof. For instance, if a voltage of the same phase is applied on each of the piezoelectric transducer elements, the focus points of the generated acoustic waves agree with the spherical center. If the phase of the voltage which drives the piezoelectric transducer elements is staggered in timing, the focus points where acoustic waves converge could be controlled while moving.

FIG. 12 shows such moving control of focus points of the piezoelectric transducer elements. Phases of pulse voltage to drive piezoelectric transducer elements are controlled so as to apply pulse voltages in staggered phases sequentially from the outer element to inner elements. The sound fields at this time converge at a geometric focus of the curved surface or at a point 17 closer to the device than to the spherical center 16. If pulse voltage of staggered phases is applied sequentially from the inner element toward outer elements, the sound fields converge at a point 18 farther than the spherical center 16. The positions of the points 17, 18 can be arbitrarily controlled with the deviation in phase of the pulse voltage.

When piezoelectric transducer elements are driven at staggered timings, if driving waveforms of elements affect adjacent elements, phase control would be disturbed to deteriorate convergence of the sound fields. However, in the case of the device of this invention, as piezoelectric transducer elements are arranged with a gap between two elements, the vibrations as well as electric signals are insulated between two elements to avoid interference between them.

Although piezoelectric transducer elements in the foregoing statement are arranged on a spherical surface, they may be arranged on other curved surfaces. One example is shown in FIG. 13.

Figure 13:
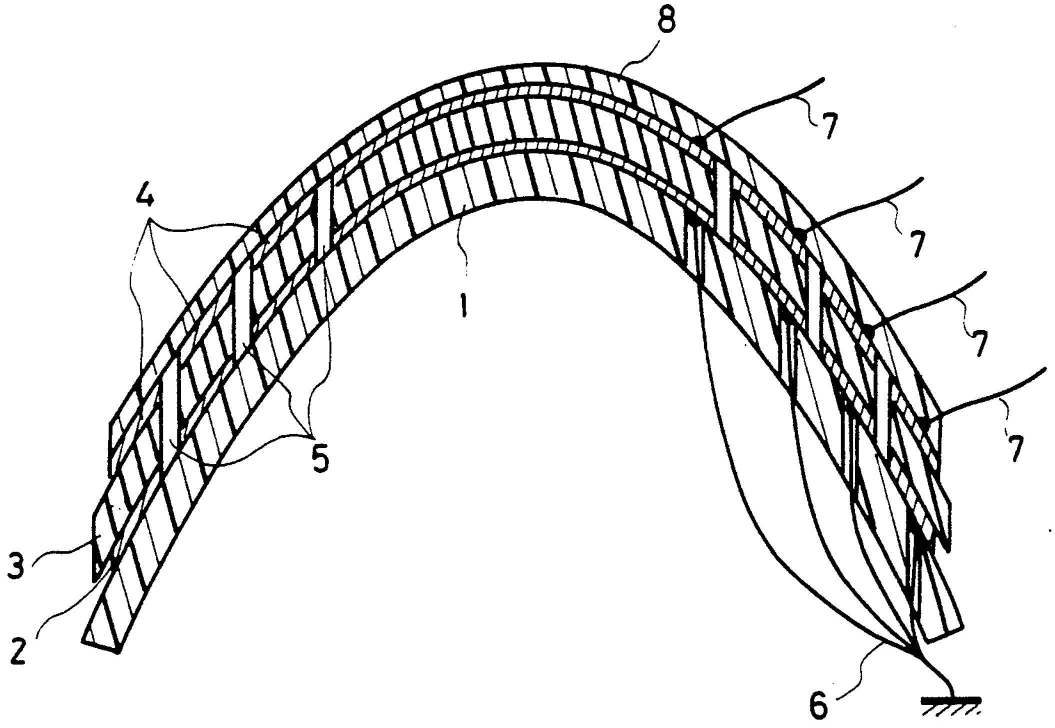
FIG. 13 is a sectional view of the fourth embodiment of the piezoelectric transducer according to this invention.

FIG. 13 shows in cross section the fourth embodiment of the piezoelectric transducer according to this invention.

In this embodiment, piezoelectric transducer elements are arranged on a parabolic surface. By using the parabolic surface, beams can be generated in parallel to each other.

Although only a few embodiments have been described in detail above, those having ordinary skill in the art will certainly understand that many modifications are possible in the preferred embodiment without departing from the teachings thereof.

All such modifications are intended to be encompassed within the following claims.

What is claimed is:

1. A piezoelectric transducer comprising:
a single base with a spherical surface;
plural piezoelectric transducer elements, at least one of which defines an annular section of a sphere, arranged along said single base, comprising a plurality of sections of piezoelectric transducer material, at least one first electrode formed between the plurality of sections of piezoelectric transducer material and said base, and at least one second electrode formed on another surface of said section of piezoelectric transducer material, wherein at least one of said first electrode and said second electrode are formed to be separate for each of said plurality of sections;
wherein said plural piezoelectric transducer elements are arranged concentrically and electrically and mechanically insulated from each other so that they can be used separately, wherein each of the plural piezoelectric transducer elements have substantially equal electrostatic capacities between the first and second electrodes.

2. The piezoelectric transducer as claimed in claim 1 wherein there is one first electrode which is used commonly for the plural piezoelectric transducer elements, and the second electrodes are provided at each of the elements separately.

3. The piezoelectric transducer as claimed in claim 1 wherein the base is formed of an organic resinous material.

4. The piezoelectric transducer as claimed in claim 1 wherein the piezoelectric transducer elements are coated with a resin coating on the surfaces thereof.

5. The piezoelectric transducer as claimed in claim 1, wherein said elements are located on a convex side of said curved surface, and wherein there is one first electrode which is used commonly for the plural piezoelectric transducer elements, and the second electrodes are provided at each of the elements separately.

6. A piezoelectric transducer comprising:
a single base defining a spherical surface;
plural piezoelectric transducer elements, at least one of which is annular in shape, arranged along said single base, comprising a plurality of sections of piezoelectric transducer material, wherein a total area of a surface of each of said transducer element is the same as a total area of a corresponding surface of each other transducer element so that each said transducer element has an equal electrostatic capacity,
at least one first electrode formed between the plurality of sections of piezoelectric transducer material and said base, and at least one second electrode formed on a surface of said section of piezoelectric transducer material,
wherein at least one of said first electrode and said second electrode are formed to be separate for each of said plurality of sections;
wherein said plural piezoelectric transducer elements are arranged concentrically and electrically and mechanically insulated from each other.

7. A transducer as in claim 6, wherein a central one of said piezoelectric transducer elements is a dome-shaped section of a sphere, and the remainder of said piezoelectric transducer elements are annular shaped sections of a sphere.

* * * * *